United States Patent
Yeap et al.

(10) Patent No.: US 10,523,206 B2
(45) Date of Patent: Dec. 31, 2019

(54) CMOS INVERTERS WITH ASYMMETRIC CONTACT DISTANCES AND METHODS OF MAKING SUCH INVERTERS

(71) Applicant: GLOBALFOUNDRIES Inc., Grand Cayman (KY)

(72) Inventors: Kong Boon Yeap, Cupertino, CA (US); Yang Liu, Clifton Park, NY (US); Tian Shen, Clifton Park, NY (US); Anjum Mehta, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 25 days.

(21) Appl. No.: 15/922,516

(22) Filed: Mar. 15, 2018

(65) Prior Publication Data
US 2019/0288690 A1    Sep. 19, 2019

(51) Int. Cl.
| | |
|---|---|
| H01L 27/02 | (2006.01) |
| H01L 27/092 | (2006.01) |
| H03K 19/0948 | (2006.01) |
| H03K 3/356 | (2006.01) |
| H03K 19/00 | (2006.01) |
| H01L 29/786 | (2006.01) |
| H01L 21/84 | (2006.01) |
| H01L 21/8238 | (2006.01) |
| H01L 27/12 | (2006.01) |
| H03K 19/0185 | (2006.01) |
| H01L 27/11 | (2006.01) |

(52) U.S. Cl.
CPC . *H03K 19/0948* (2013.01); *H01L 21/823885* (2013.01); *H01L 21/84* (2013.01); *H01L 27/0203* (2013.01); *H01L 27/0207* (2013.01); *H01L 27/0924* (2013.01); *H01L 27/1104* (2013.01); *H01L 27/1203* (2013.01); *H01L 29/78642* (2013.01); *H03K 3/356113* (2013.01); *H03K 19/0013* (2013.01); *H03K 19/018521* (2013.01)

(58) Field of Classification Search
CPC ....... H03K 19/018521; H03K 19/0013; H03K 19/0948; H01L 27/0207; H01L 27/0924; H01L 27/0203; H01L 27/1104
See application file for complete search history.

(56) References Cited

U.S. PATENT DOCUMENTS

| | | | |
|---|---|---|---|
| 5,486,716 A | * | 1/1996 | Saito ............... H01L 27/0266 257/355 |
| 5,625,568 A | | 4/1997 | Edwards et al. |

(Continued)

*Primary Examiner* — Allen L Parker
*Assistant Examiner* — Gustavo G Ramallo
(74) *Attorney, Agent, or Firm* — Amerson Law Firm, PLLC

(57) ABSTRACT

One illustrative method disclosed herein includes forming a first transistor for an inverter and forming asymmetrically spaced first and second conductive contact structures that are conductively coupled to the source region and the drain region, respectively, of the transistor. In this example, the first conductive contact structure (for the source region) is positioned a first predetermined target distance from a first side of the gate structure of the transistor, and the second conductive contact structure (for the drain region) is positioned a second predetermined target distance from a second side of the gate structure, wherein the second predetermined target distance is less than the first predetermined target distance.

17 Claims, 10 Drawing Sheets

(56) References Cited

U.S. PATENT DOCUMENTS

| | | | | |
|---|---|---|---|---|
| 6,121,660 A * | 9/2000 | Yamazaki | ............ | H01L 27/1214 |
| | | | | 257/348 |
| 6,229,186 B1 | 5/2001 | Ishida | | |
| 6,297,668 B1 | 10/2001 | Schober | | |
| 6,608,744 B1 * | 8/2003 | Kato | ................... | H01L 27/0266 |
| | | | | 361/111 |
| 2009/0236665 A1 * | 9/2009 | Lin | ..................... | H01L 29/0653 |
| | | | | 257/368 |
| 2013/0170275 A1 * | 7/2013 | Kumar | ................. | G11C 11/412 |
| | | | | 365/63 |
| 2016/0372414 A1 * | 12/2016 | Song | .............. | H01L 21/823821 |

* cited by examiner

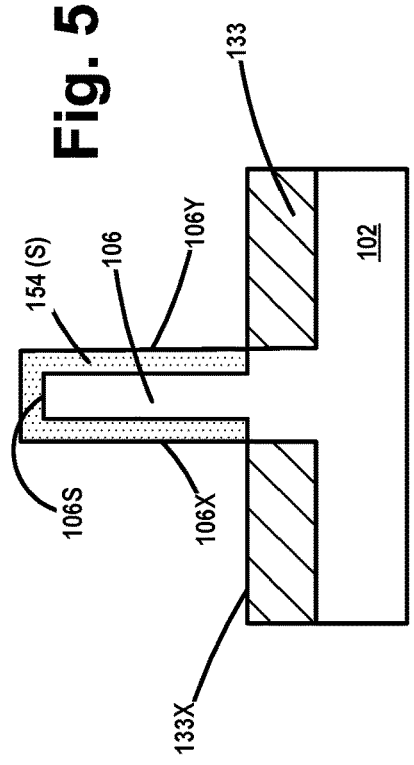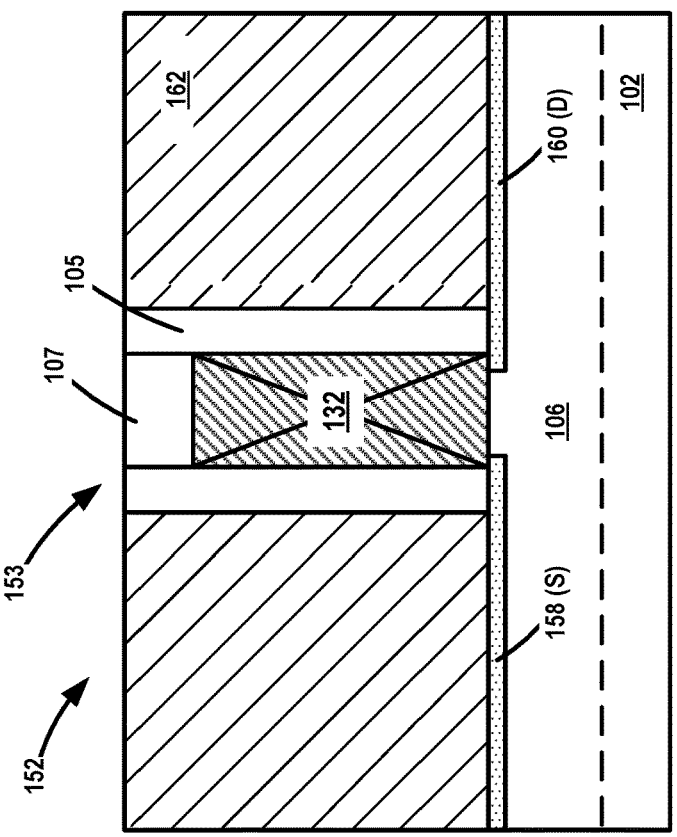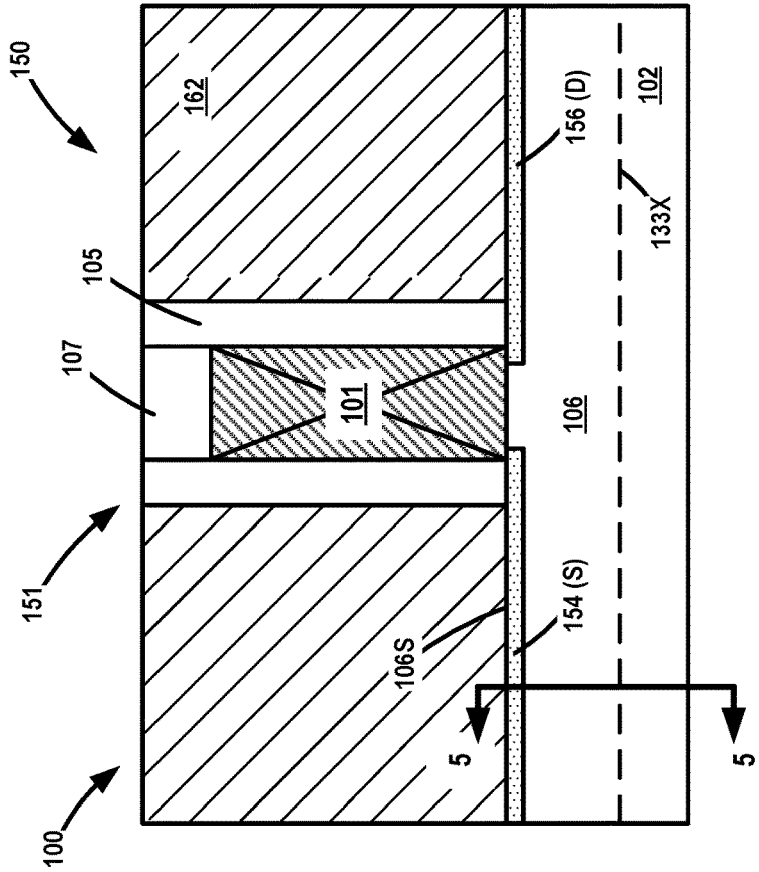

CMOS INVERTERS WITH ASYMMETRIC CONTACT DISTANCES AND METHODS OF MAKING SUCH INVERTERS

BACKGROUND OF THE DISCLOSURE

1. Field of the Disclosure

The present disclosure generally relates to the fabrication of semiconductor devices, and, more particularly, to various CMOS (Complementary Metal Oxide Semiconductor) inverter structures and methods of making such inverters.

2. Description of the Related Art

An inverter circuit outputs a voltage representing the opposite logic-level to its input. The main function of an inverter is to invert the input signal applied to its input, i.e., an inverter circuit outputs a voltage representing the opposite logic-level to the voltage applied to its input. If the applied input voltage is logically low, then the output voltage becomes high and vice versa. Inverters come in a variety of configurations. In one example, inverters can be constructed using two complementary transistors in a CMOS configuration—one NMOS transistor and one PMOS transistor. Relative to other inverter configurations, a CMOS-based inverter greatly reduces power consumption since one of the transistors is always off in both logic states. Inverters are employed in a variety of different circuits in integrated circuit (IC) products, such as, for example, logic circuits, memory circuits, RF products, optical semiconductors, etc.

In general, memory devices are the means by which electrical information is stored. There are many types of memory devices, e.g., SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Billions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

FIG. 1 depicts a typical prior art 6T (six-transistor) SRAM memory cell 10 that includes two CMOS-based inverters—INV1 and INV2. In general, the SRAM cell 10 includes two NMOS pass gate transistors PG1, PG2, two PMOS pull-up transistors PU1, PU2, and two NMOS pull-down transistors PD1, PD2. Each of the PMOS pull-up transistors PU1, PU2 has its gate (14A, 14B, respectively) connected to the gate (16A, 16B, respectively) of a corresponding NMOS pull-down transistor PD1, PD2. The PMOS pull-up transistors PU1, PU2 have their drain regions (D) connected to the drain regions of corresponding NMOS pull-down transistors PD1, PD2 to form the inverters INV1 and INV2, each of which have a conventional configuration. The source regions (S) of the PMOS pull-up transistors PU1, PU2 are connected to a high reference potential, typically Vdd. The source regions (S) of the NMOS pull-down transistors PD1, PD2 are connected to a lower reference potential, typically Vss or ground. The PMOS pull-up transistor PUI and the NMOS pull-down transistor PD1 make up the first inverter INV1 of the SRAM cell 10. The PMOS pull-up transistor PU2 and the NMOS pull-down transistor PD2 make up the second inverter INV2 of the SRAM cell 10.

The gate 14A of the PMOS pull-up transistor PUI and the gate 16A of the NMOS pull-down transistor PD1 are cross-coupled (i.e., connected) to the drain regions (D) of the transistors PU2, PD2 of the other inverter at node N2. Similarly, the gate 14B of the PMOS pull-up transistor PU2 and the gate 16B of the NMOS pull-down transistor PD2 are cross-coupled (i.e., connected) to the drain regions (D) of the transistors PU1, PD1 at node N1. Hence, the potential present on the drain regions of the transistors PU1, PD1 (node N1) of the first inverter is applied to the gates of transistors PU2, PD2 of the second inverter and the charge serves to keep the second inverter in an ON or OFF state. The logically opposite potential is present on the drain regions of the transistors PU2, PD2 (node N2) of the second inverter and on the gates of the transistors PU1, PD1 of the first inverter, keeping the first inverter in the complementary OFF or ON state relative to the second inverter. Thus, the latch of the illustrated SRAM cell 10 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 10 can be quantified by the margin by which the potential on the charge storage nodes can vary from its nominal value while still keeping the SRAM 10 cell in its original state.

The present disclosure is directed to various CMOS-based inverter structures and methods of making such inverters for various types of circuits in various types of IC products.

SUMMARY OF EMBODIMENTS OF THE DISCLOSURE

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various CMOS-based inverter structures and methods of making such inverters for various types of circuits in various types of IC products. One illustrative method disclosed herein includes forming a first transistor for an inverter above a semiconductor substrate and forming asymmetrically spaced first and second conductive contact structures that are conductively coupled to the source region and the drain region, respectively, of the transistor. In this example, the first conductive contact structure (for the source region) is positioned a first predetermined target distance from a first side of the gate structure of the transistor, and the second conductive contact structure (for the drain region) is positioned a second predetermined target distance from a second side of the gate structure, wherein the second predetermined target distance is less than the first predetermined target distance.

One illustrative inverter disclosed herein includes first and second transistors (opposite types) that share a first gate structure and a conductive source contact structure that is conductively coupled to the source region of the first transistor, wherein the conductive source contact structure has a first lateral dimension, in a gate length direction of the first transistor, and wherein the conductive source contact structure is positioned a first distance from a first side of the first gate structure. In this example, the inverter also includes a common conductive drain contact structure that is conductively coupled to the drain region of both the first and second transistors, wherein the common conductive drain contact structure has a second lateral dimension that is greater than the first lateral dimension, and wherein the common conductive drain contact structure is positioned a second distance from a second side of the first gate structure, wherein the second distance is less than the first distance.

Another illustrative method disclosed herein for forming an integrated circuit product includes forming a first inverter comprised of first and second transistors that are of opposite types, wherein the first and second transistors share a first gate structure, and forming a second inverter comprised of third and fourth transistors that are of opposite types, wherein the third and fourth transistors share a second gate structure that is positioned immediately adjacent the first gate structure. In this embodiment, the first and second gate structures are formed with a first gate pitch. The method also includes forming a third gate structure positioned immediately adjacent the first gate structure, wherein the first and third gate structures are formed with a second gate pitch, and forming a fourth gate structure positioned immediately adjacent the second gate structure, wherein the second and fourth gate structures are also formed with the second gate pitch. In this illustrative embodiment, the second gate pitch is less than the first gate pitch.

BRIEF DESCRIPTION OF THE DRAWINGS

The disclosure may be understood by reference to the following description taken in conjunction with the accompanying drawings, in which like reference numerals identify like elements, and in which:

FIGS. 2-11 are various views that depict various CMOS-based inverter structures disclosed herein and methods of making such inverters for various types of circuits in various types of IC products.

Figure 1:
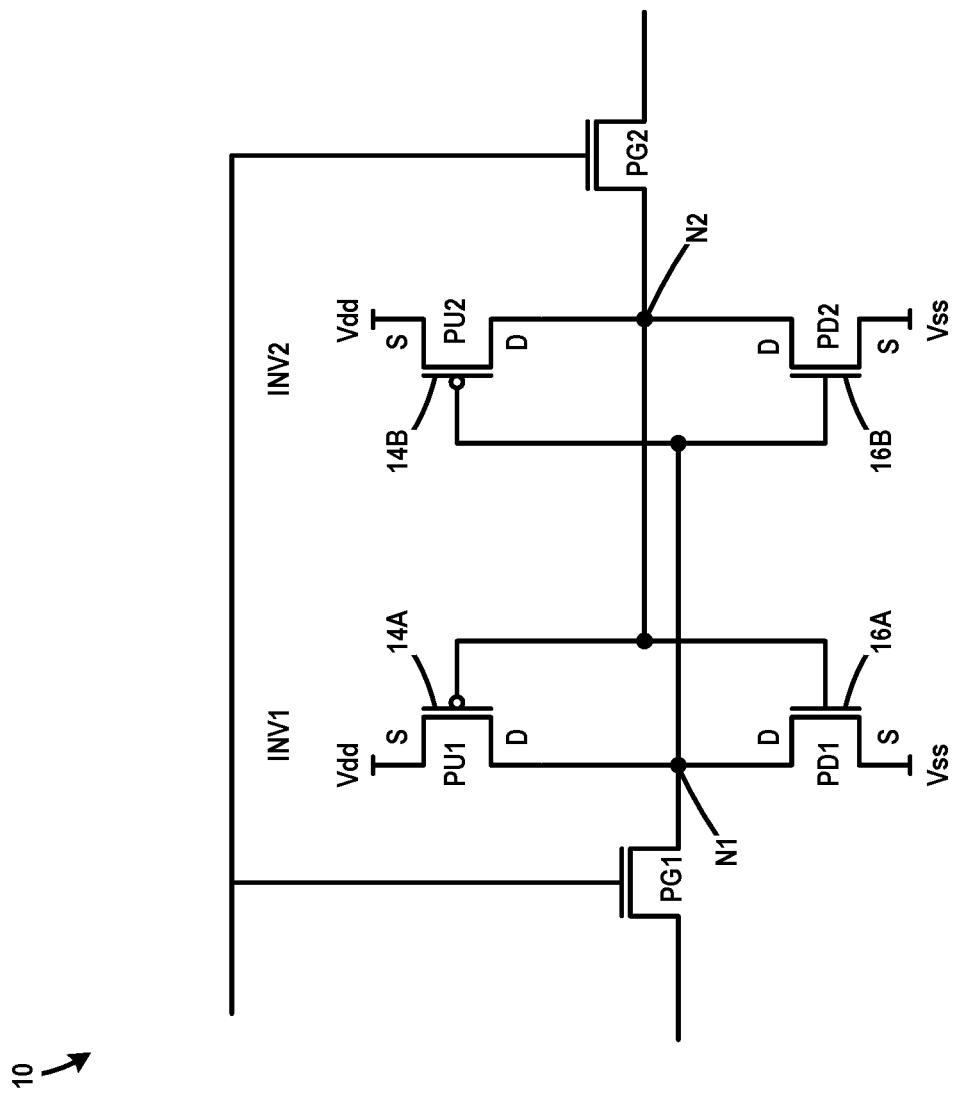
FIG. 1 is an electrical schematic of an illustrative prior art SRAM device that includes two CMOS-based inverters.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various CMOS-based inverter structures and methods of making such inverters for various types of circuits in various types of IC products. As will be appreciated by those skilled in the art after a complete reading of the present application, the inverters disclosed herein may be employed in a variety of different applications. In the specific examples discussed herein, the inverters disclosed herein will be described as being part of an illustrative SRAM cell. Of course, as is known to those skilled in the art, other applications where such inverters may be employed include, but are not limited to, various devices that are typically found in the logic portion of an IC product, etc. Thus, the inventions disclosed and claimed herein should not be considered to be limited to any particular application. With reference to the attached figures, various illustrative embodiments of the methods and devices disclosed herein will now be described in more detail.

FIGS. 2-11 are various views that depict the multiple CMOS-based inverter structures and methods of making such inverters for various types of circuits in various types of IC products 100. By way of example only, the illustrative transistors for the inverters depicted herein are FinFET transistors. However, as will be appreciated by those skilled in the art after a complete reading of the present application, the inverters disclosed herein may be manufactured using transistors having a different configuration, e.g., planar transistors, vertical transistors, etc. Thus, the presently disclosed inventions should not be considered to be limited to use with any particular form of transistor device.

Figure 2:
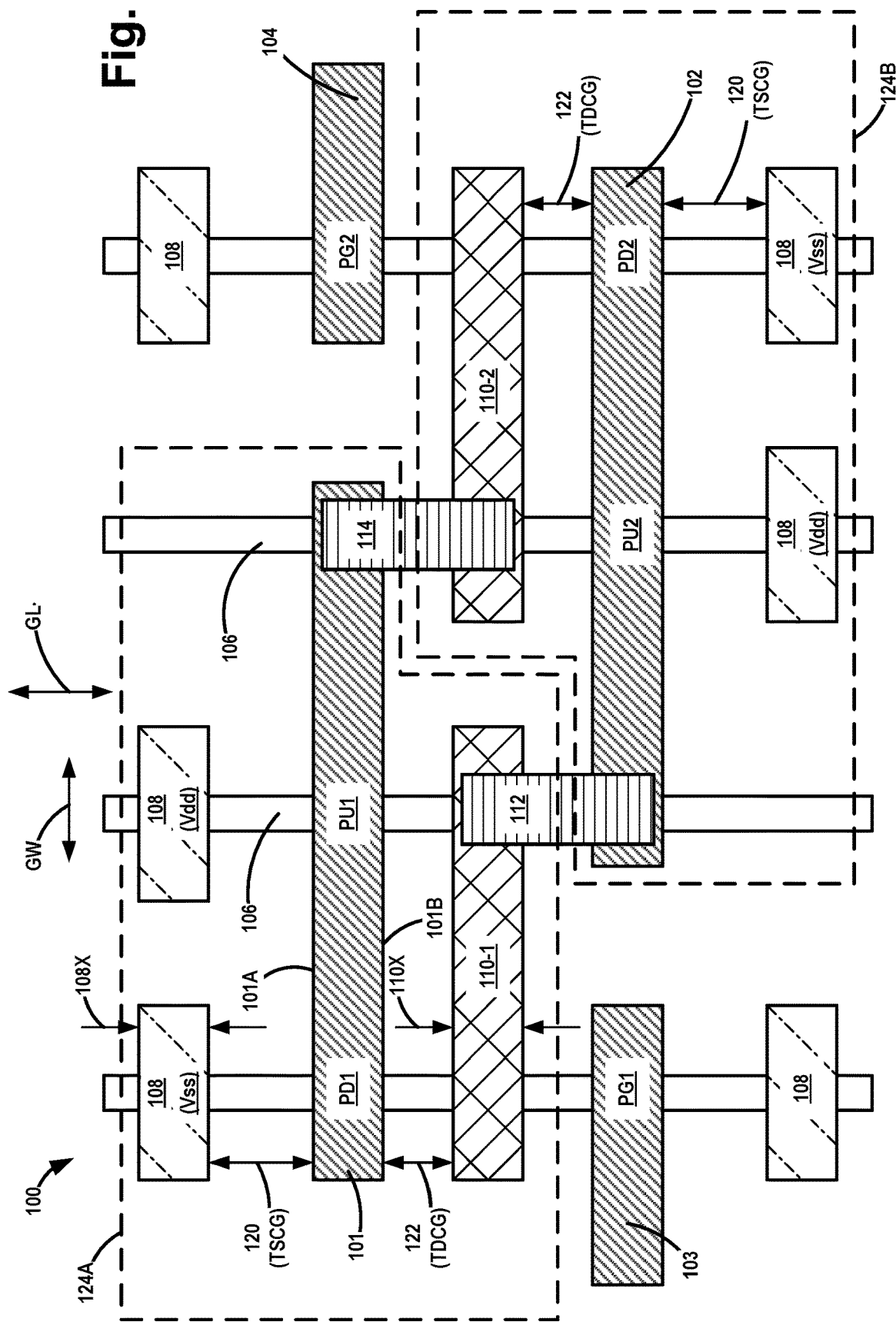

FIG. 2 is a simplistic plan view of an SRAM cell that includes six illustrative and schematically depicted transistor devices: two NMOS pass gate transistors PG1, PG2, two PMOS pull-up transistors PU1, PU2, and two NMOS pull-down transistors PD1, PD2. Also depicted is a plurality of fins 106. The transistors PD1 and PU1 share a first common conductive inverter gate structure 101, while the transistors PD2 and PU2 share a second common conductive inverter gate structure 102. The pass gate transistors PG1, PG2 have their own dedicated gate structures 103, 104, respectively. Of course, each of the transistors in FIG. 2 have a doped source region and a doped drain region (neither of which is shown in FIG. 2). Each of the transistor devices also includes a conductive source contact structure 108 and a conductive drain contact structure that is generically referenced using the numeral 110. In the depicted example, the drain regions of the PD1 and PU1 transistors share a common first drain contact structure 110-1, and the drain regions of the PD2 and PU2 transistors share a common second drain contact structure 110-2 (again collectively referenced using the numeral 110). The SRAM cell includes first and second inverter structures 124A, 124B, respectively. The first inverter 124A comprises the first common conductive inverter gate structure 101, the PD1 and PU1 transistors and their associated source/drain contact structures 108, 110-1, respectively. The second inverter 124B comprises the second common conductive inverter gate structure 102, the PD2 and PU2 transistors and their associated source/drain contact structures 108, 110-2, respectively. The common drain contact structure 110-1 for the drain regions of the PD1 and PU1 transistors in the first inverter 124A is coupled to the second common conductive inverter gate structure 102 by a first cross-coupled contact 112. The common drain contact structure 110-2 for the drain regions of the PD2 and PU2 transistors in the second inverter 124B is coupled to the first common conductive inverter gate structure 101 by a second cross-coupled contact 114. The source contact structures 108 of the PMOS pull-up transistors PU1, PU2 are connected to a relatively higher reference potential, typically Vdd. The source contact structures 108 of the NMOS pull-down transistors PD1, PD2 are connected to a relatively lower reference potential, typically Vss or ground.

The source contact structures 108 and the drain contact structures 110 are physical structures that may have a variety of configurations and may be comprised of one or more conductive materials. The source contact structures 108 and the drain contact structures 110 are separated from their associated conductive gate structure 101 or 102 by insulating materials that may take a variety of forms, e.g., portions of one or more sidewall spacers (not shown) positioned adjacent the conductive gate structure (e.g., 101, 102), a portion of a contact etch stop layer (not shown), a portion of a layer of insulating material (not shown) positioned above the source and drain regions of the devices, etc. For example, the source contact structures 108 of the PD1 and PU1 transistors are separated from a first sidewall 101A of the first common conductive inverter gate structure 101 by a predetermined target source contact-to-gate (TSCG) spacing 120, while the first common drain contact structure 110-1 of the PD1 and PU1 transistors is separated from a second sidewall 101B of the first common conductive inverter gate structure 101 by a predetermined target drain contact-to-gate (TDCG) spacing 122, wherein the TDCG spacing 122 is intentionally less than the TSCG spacing 120, for reasons that will be explained more fully below. The same TSCG spacing 120 and TDCG spacing 122 is present for the PD2 and PU2 transistors of the second inverter 124B relative to the second common conductive inverter gate structure 102. The TSCG spacing 120 and the TDCG spacing 122 is measured in a direction in the current transport direction or gate-length (GL) of the transistor devices at a level that corresponds to a level of an uppermost surface of the conductive gate structure. This asymmetrical spacing of the source contact structures 108 and the drain contact structures 110 relative to their associated conductive gate structure is very different from prior art inverter structures, wherein the conductive source/drain contact structures were positioned symmetrically about the gate structure, i.e., the target spacing between the gate structure and each of the conductive source/drain structures in such prior art symmetrical inverter structures was approximately the same.

During operation of an inverter structure, the source contact structures 108 of the PD1, PU1, PD2 and PU2 transistors are always exposed to an applied unipolar AC voltage. That is, the source contact structures 108 of the N-type transistors PD1 and PD2 are always exposed to Vss (or ground), while the source contact structures 108 of the P-type transistors PU1 and PU2 are always exposed to Vdd. In contrast, the drain contact structures 110 of the transistor devices PD1, PU1, PD2 and PU2 are always exposed to an applied bipolar AC voltage, i.e., the voltage applied to the drain contact structures 110 for the transistor devices PD1, PU1, PD2 and PU2 is always cycling between Vdd voltage and Vss (or ground) voltage. Moreover, for an inverter, such as the first inverter 124A, the voltage applied to the first common conductive inverter gate structure 101 and the common drain contact structure 110-1 of the transistors PD1 and PU1 is always trending in opposite directions due to the "flipping" of the voltage applied to the first common conductive inverter gate structure 101. That is, if the voltage on the common drain contact structure 110-1 is "low", the voltage on the first common conductive inverter gate structure 101 is "high" and vice-versa. Additionally, unlike the source contact structures 108 that experience only unipolar voltage, the RC delays associated with the bipolar voltage conditions applied to the drain contact structures 110 can be significant and can impact device performance.

During operation, an inverter may experience breakdown of the dielectric or insulating materials positioned between the source contact structure 108 and gate structure as well as breakdown of the dielectric or insulating materials positioned between the drain contact structure 110 and the gate structure. This may sometimes be referred to as MOL (middle-of-line) TDDB (time-dependent-dielectric breakdown) since the source contact structures 108 and the drain contact structures 110 are conductive structures that are typically manufactured in what are referred to as middle-of-line (MOL) processing operations. This MOL dielectric breakdown can lead to total device failure, as it may create an unwanted short circuit between the source contact structure 108 and the conductive gate structure and/or between the drain contact structure 110 and the conductive gate structure.

All other things being equal, if the source contact structures 108 and the drain contact structures 110 are spaced symmetrically about their associated conductive gate structure, i.e., if the spacing between the source contact structures 108 and the drain contact structures 110 and the nearest edge of their associated conductive gate structure is approximately the same, the useful life of the source contact structure 108 is much less, e.g., 100+ times less, than the symmetrically positioned drain contact structure 110 on the opposite side of the conductive gate structure. Thus, prior art symmetrical inverter design wherein the source contact structures 108 and the drain contact structures 110 were positioned symmetrically with respect to the gate structure is not optimized for efficiency since there is such a great disparity in the useful life of the source contact structures 108 and the drain contact structures 110 in such prior art symmetrical inverter designs.

Thus, in accordance with various embodiments of the asymmetrical inverters disclosed herein, as shown in, for example, FIG. 2, the source contact structure 108 is positioned on the device proximate its predetermined targeted position such that it is spaced a first predetermined target distance—the TSCG spacing 120—from a first side 101A of the conductive gate structure 101 and the drain contact structure 110 is positioned on the device proximate its predetermined targeted position such that it is spaced a second predetermined target distance—the TDCG spacing 122—from a second side 101B of the gate structure 101, wherein the second predetermined target distance—the TDCG spacing 122—is made intentionally smaller than the first predetermined target distance—the TSCG spacing 120. Of course, it is anticipated that the source contact structures 108 and the drain contact structures 110 will be formed at a location corresponding to their intended and predetermined targeted positions, i.e., the patterned etch mask that will be formed to form contact openings in one or more layers of insulating materials for the source contact structures 108 and the drain contact structures 110 will be formed above the substrate at its desired location, wherein there is substantially little if any misalignment as it relates to the positioning of the patterned etch mask at its intended location so as to result in the later formation of the source contact structure 108 and the drain contact structure 110 at their predetermined targeted locations as anticipated by the design process. That is, it is anticipated that there will be little to no misalignment as it relates to the formation of the actual source contact structure 108 and the actual drain contact structure 110 proximate their intended and predetermined targeted positions such that they exhibit their different desired spacing from their associated gate structure, i.e., the smaller second predetermined target distance—the TDCG spacing 122—for the drain contact structure 110 and the larger first predetermined target distance—the TSCG spacing 120—for the source contact structure 108. This predetermined asymmetrically targeted spacing and positioning of the source contact structures 108 and the drain contact structures 110 relative to their associated gate structure provides significant benefits. For example, by reducing the TDCG spacing 122 as compared to the corresponding spacing in prior art symmetric inverter designs, the overall footprint of the various asymmetric inverters disclosed herein may be reduced relative to prior art symmetric inverter designs, thereby saving plot space and allowing for greater packing densities. Of course, by positioning the drain contact structure 110 closer to the conductive gate structure in the various asymmetric inverters disclosed herein, the capacitance between the gate structure and the drain contact structure 110 will increase, but this increased capacitance may be more than offset by the advantages achieved by enabling greater packing densities. Additionally, by positioning the drain contact structure 110 closer to the conductive gate structure in the various asymmetric inverters disclosed herein, the effective lifetime of the drain contact structure 110 may be reduced as compared to its useful life when the drain contact structure is spaced farther away from the conductive gate structure. However, such a reduction in the useful life of the asymmetrically positioned drain contact structures 110 disclosed herein is not problematic, as reduced life of the drain contact structure 110 is still greater than the source contact structure 108, i.e., the overall useful life of the inverter is still limited by the shorter useful life of the source contact structure 108. On the other hand, if the plot space allotted for the various asymmetric inverter designs disclosed herein is the same as that allotted for prior art symmetrical inverter designs, then the physical size of the drain contact structures 110 may be made larger than that of the source contact structures 108, which will tend to reduce the resistance of the drain contact structures 110 and the associated RC time delays experienced by the inverter during operation.

With reference to FIG. 2, the difference between the TDCG spacing 122 and the TSCG spacing 120 for the various embodiments disclosed herein may vary depending upon the particular application. In one illustrative embodiment, the TDCG spacing 122 may preferably be about 1 nm less than the TSCG spacing 120. In percentage terms, in one embodiment, the TDCG spacing 122 may preferably be about 70-90% of the TSCG spacing 120. In the example shown in FIG. 2, the source contact structures 108 have a lateral dimension 108X, e.g., a lateral width (in the gate length (GL) direction), and the drain contact structures 110 have a lateral dimension 110X (in the gate length (GL) direction), wherein the dimensions 108X and 110X are approximately the same. That is, in one embodiment, the source contact structures 108 and the drain contact structures 110 on the various asymmetric inverter structures disclosed herein may be the same approximate physical size.

Figure 3:
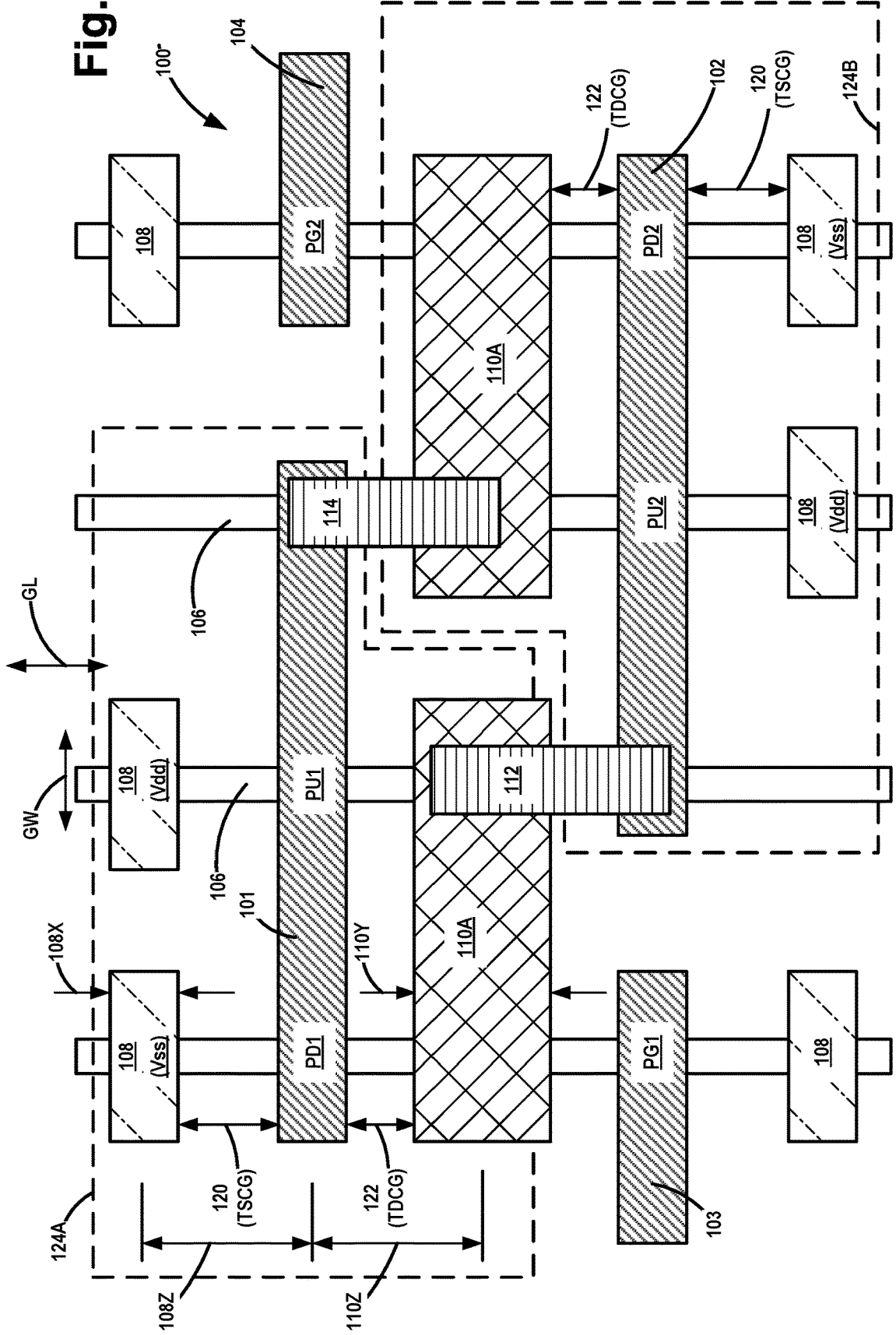

FIG. 3 depicts an example of an asymmetric inverter disclosed herein wherein the desired lesser TDCG spacing 122 is achieved by making the drain contact structures 110A physically larger than the source contact structures 108. The source contact structures 108 and the drain contact structures 110 disclosed herein are three-dimensional structures having a lateral width in the gate length (GL) direction (running top to bottom in FIG. 3) of the transistor devices, an axial length in the gate width (GW) direction of the transistor devices (running left to right in FIG. 3) and a vertical height in a direction running into and out of the plane of the drawing of FIG. 3. More specifically, in the example shown in FIG. 3, the source contact structures 108 have a lateral dimension 108X, e.g., a lateral width (in the gate length (GL) direction), and the drain contact structures 110A have a lateral dimension 110Y (in the gate length (GL) direction), wherein the dimension 110Y is greater than the dimension 108X. Also note that, in this illustrative example, the source contact structures 108 and the drain contact structures 110 are positioned such that the vertical centerlines (running into and out of the plane of drawing page for FIG. 3) of the source contact structures 108 and the drain contact structures 110 are positioned approximately the same distance 108Z, 110Z, respectively, from the vertical centerline of their associated conductive gate structure, e.g., the gate structure 101. However, such symmetric positioning of the vertical centerlines of the source contact structures and the drain contact structures relative to the vertical centerline of the conductive gate structure is not required. In some applications, the drain contact structures may be made physically larger than the source contact structures and the vertical centerlines of the drain contact structures may be shifted closer to the conductive gate structure than the vertical centerlines of the source contact structures. With reference to FIG. 3, in one illustrative embodiment, the dimension 110Y may be about 2-3 nm greater than the dimension 108X. In percentage terms, in one embodiment, the dimension 110Y may be about 120% of the dimension 108X.

The source contact structures 108 and the drain contact structures 110 disclosed herein may have a variety of configurations and may be comprised of one or more conductive materials. In some applications, the source contact structures 108 and the drain contact structures 110 may take the form of "trench silicide" (TS) structures. The source contact structures 108 and the drain contact structures 110 may be in the form or shape of line-type features (when viewed from above) that are formed or positioned in one or more layers of insulating material (not shown in FIG. 2). In some applications, the source contact structures 108 may be line-type features that extend across the entire active region on the source region of each transistor in a direction that corresponds to a gate width (GW) (see FIG. 2) direction of the transistors. The gate length (GL) or current-transport direction of the illustrative transistors shown in FIG. 2 is also depicted in the drawing. In yet other applications, the drain contact structures 110 may be line-type features that extend across the entire active region on the drain regions of two transistors in the gate width direction of the transistors. In even other applications, the source contact structures 108 and the drain contact structures 110 may take the form of discrete contact elements, i.e., one or more individual contact plugs having a generally square-like shape or cylindrical shape when viewed from above. Irrespective of their form, the source contact structures 108 and the drain contact structures 110 may be contacted by various contact structures (conductive lines and/or vias) formed in one or more metallization layers formed above the transistor devices (e.g., M0; M1/V0, etc.)

The formation of the source contact structures 108 and the drain contact structures 110 with the desired lesser TDCG spacing 122 may be accomplished in several ways. In general, in the case where the source contact structures 108 and the drain contact structures 110 are formed using non-self-aligned techniques, the desired TDCG spacing 122 may be achieved by use of appropriate patterned etch masks that are intentionally formed with asymmetrical sized mask openings and/or asymmetrical spacing between mask openings in such a patterned etch mask. FIGS. 4-9 depict various illustrative process flows wherein various embodiments of the source contact structures 108 and the drain contact structures 110 may be formed using non-self-aligned techniques.

FIG. 4 depicts an IC product 100 wherein an inverter structure disclosed herein and other transistor devices and circuits will be formed above a semiconductor substrate 102 by forming a plurality of illustrative FinFET transistor devices. FIG. 4 is a cross-sectional view of the product 100 taken along the long axis of a fin 106 of the devices in a direction corresponding to the gate length (current transport direction) of the illustrative FinFET devices depicted herein. FIG. 5 is a cross-sectional view taken through a source region 154 of an illustrative inverter transistor 150 at the illustrative location indicated in FIG. 4. In the illustrative examples depicted herein, the FinFET devices will be depicted as having doped source/drain regions that are formed in the fin 106 adjacent the top surface 106S of the fin 106 and both side surfaces 106X, 106Y of the fin 106, i.e., a tri-gate FinFET device. Of course, if desired, the source/drain regions could be formed adjacent only the side surfaces 106X, 106Y of the fin 106. Also depicted in FIG. 5 is isolation material 133, e.g., silicon dioxide, with an upper surface 133X. The doped source/drain regions are formed in the exposed portion of the fin 106 above the upper surface 133X of the insulation material 133. The cross-sectional view shown in FIG. 4 (and other cross-sectional drawings) only depicts the portion of the source/drain regions of the transistor devices that is formed in the fin 106 adjacent the upper surface 106S of the fin 106.

In general, the product 100 comprises the above-referenced inverter transistor 150 and a non-inverter transistor 152. The inverter transistor 150 is intended to be representative of any of the transistors that are part of an inverter with the desired asymmetric spacing for the source contact structure 108 and the drain contact structure 110, as described above. The inverter transistor 150 may be formed in any type of circuit, e.g., logic circuits, memory circuits, ASICs, etc. In connection with the illustrative inverters 124A, 124B described above, the inverter transistor 150 is intended to be representative of any of the PD1, PU1, PD2 and PU2 transistors shown above. The non-inverter transistor 152 is intended to be representative of any type of transistor that is formed above the substrate 102 for any type of non-inverter circuit. The non-inverter transistor 152 may be formed in any type of circuit, e.g., logic circuits, memory circuits, etc. The inverter transistor 150 and the non-inverter transistor 152 may be formed immediately adjacent one another on the substrate 102, or they may be spaced apart from one another on the substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

With continuing reference to FIGS. 4 and 5, the transistors 150, 152 comprise a gate 151, 153, respectively. The gates 151, 153 may be the same for the different transistors 150, 152 or they may be different in terms of material composition and/or physical size. The gate 151 of the inverter transistor 150 comprises the above-described conductive gate structure 101, a sidewall spacer 105 and a gate cap 107. Also depicted in FIG. 4 are a doped source region 154 and a doped drain region 156 that have been formed in the substrate 102 for the inverter transistor 150. The doped source region 154 is also depicted in FIG. 5. The gate 153 of the non-inverter transistor 152 also comprises a conductive gate structure 132, a sidewall spacer 105 and a gate cap 107. Also depicted in FIG. 4 are a doped source region 158 and a doped drain region 160 that have been formed in the substrate 102 for the non-inverter transistor 152. Also depicted is a layer of insulating material 162 (e.g., silicon dioxide) that has been formed above the substrate 102. The layer of insulating material 162 should be understood to be representative of one or more layers of insulating material that may be formed above the substrate.

The conductive gate structures 101, 132 may be made of the same or different materials and they may have the same or different physical sizes in terms of height and/or width (in the gate length direction). The conductive gate structures 101, 132 for the various transistor devices are representative in nature and they may be comprised of a variety of different materials and they may be formed using gate-first or replacement-gate manufacturing techniques. Each of the conductive gate structures 101, 102, 103, 104, 132 comprises a gate insulation layer (not separately shown) and a conductive gate electrode (not separately shown). The gate insulation layer may be comprised of a material such as silicon dioxide or a high-k (k value greater than 10) insulating material. The gate electrode may be comprised of one or more of a variety of different conductive materials, e.g., a metal, a metal alloy, titanium nitride, tantalum nitride, tungsten, aluminum, polysilicon, etc., and it may be formed to any desired thickness. FIGS. 4 and 5 depict the transistors 150, 152 after various ion implantation processes were performed though patterned implant masks (not shown) to form the doped regions 154, 156, 158 and 160 in the substrate 102 (or in the fin 106 in the case where the transistors are FinFET devices). Other doped regions, such as halo implant regions and well implant regions, are not depicted in the drawings. The sidewall spacers 105 and gate caps 107 may be made of a material such as silicon nitride and they may be formed using various known techniques. Of course, as will be appreciated by those skilled in the art, various other materials that may be formed on the transistors 150, 152 are not depicted in the drawings so as to simplify presentation of the presently disclosed inventions. For example, the transistors may also include epitaxial semiconductor material (not shown) that is formed in the source/drain regions of the transistor devices, metal silicide materials (not shown) formed on the doped source/drain regions, contact etch stop layers (not shown), etc.

Figure 6:
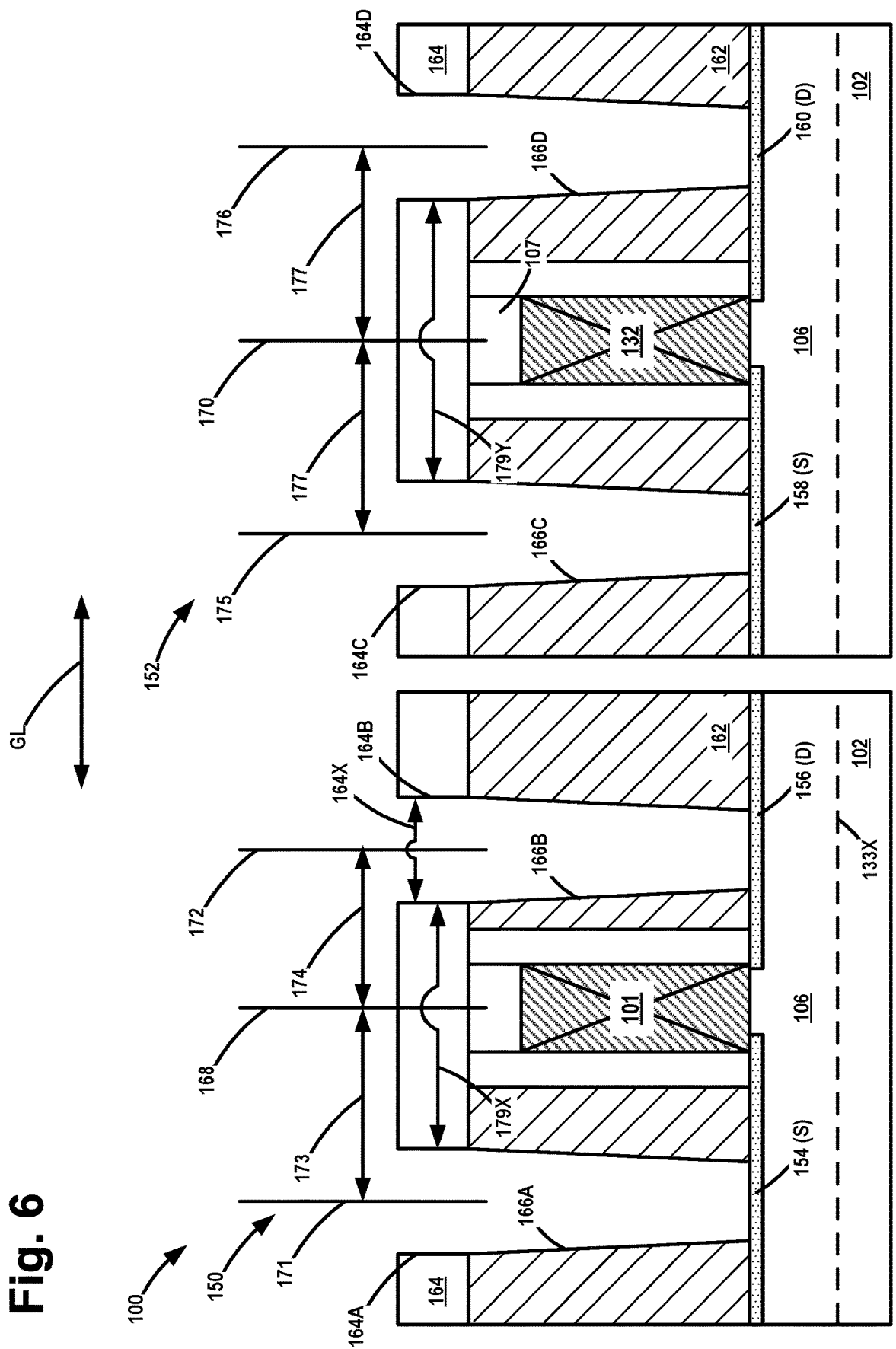

FIG. 6 depicts the product 100 after several process operations were performed. First, a patterned etch mask 164, e.g., a patterned layer of photoresist or a patterned hard mask, was formed above the layer of insulating material 162 and both the inverter transistor 150 and the non-inverter transistor 152. The patterned etch mask 164 comprises a plurality of mask contact openings 164A, 164B, 164C and 164D. Thereafter, one or more common etching processes were performed through the patterned etch mask 164 to simultaneously define a plurality of SD contact openings 166A, 166B, 166C and 166D so as to expose portions of the source/drain regions 154, 156, 158 and 160, respectively, of the devices 150, 152. In one embodiment, each of the mask openings 164A-D in the patterned etch mask 164 are the same size, i.e., each of the mask openings 164A-D has a dimension 164X (e.g., a width) in the gate length (GL) direction of the transistor devices that is the same. The mask openings 164A-D may be all the same size or may be different sizes in the gate width (GW) direction of the devices, i.e., into and out of the plane of FIG. 5. The mask openings 164A-B are intentionally formed in the patterned etch mask 164 with a predetermined spacing and positioning such that the resulting source contact structure 108 and the drain contact structure 110 that will be formed for the inverter transistor 150 in the SD contact openings 166A, 166B, respectively, will be spaced asymmetrically relative to the conductive gate structure 101 and have the desired lesser TDCG spacing 122, as described above. The mask openings 164C-D are intentionally formed in the patterned etch mask 164 with a predetermined spacing and positioning such that the resulting source contact structure 108 and the drain contact structure 110 that will be formed for the non-inverter transistor 152 in the SD contact openings 166C, 166D, respectively, will be spaced symmetrically relative to the conductive gate structure 132, i.e., the source contact structure 108 and the drain contact structure 110 on the non-inverter transistor 152 will be equally spaced from the conductive gate structure 132.

More specifically, and with continued reference to FIG. 6, the conductive gate structure 101, the mask opening 164A, the mask opening 164B, the conductive gate structure 132, the mask opening 164C and the mask opening 164D have vertical centerlines 168, 171, 172, 170, 175 and 176, respectively. The mask openings 164A, 164B correspond to the location where the source contact structure 108 and the drain contact structure 110, respectively, will be formed for the inverter transistor 150 in the insulating material 162. The mask openings 164C, 164D correspond to the location where the source contact structure 108 and the drain contact structure 110, respectively, will be formed for the non-inverter transistor 152 in the insulating material 162. In this example, the patterned etch mask 164 is intentionally formed and positioned such that the vertical centerline 171 of the mask opening 164A is spaced a predetermined and greater distance 173 from the vertical centerline 168 of the conductive gate structure 101 than is the mask opening 164B, which is spaced a predetermined shorter distance 174 from the vertical centerline 168 of the conductive gate structure 101. In contrast, the patterned etch mask 164 is intentionally formed and positioned such that the vertical centerlines 175, 176 of the mask openings 164C, 164D are each spaced a predetermined equal distance 177 from the vertical centerline 170 of the conductive gate structure 132. Additionally, the openings 164A, 164B (above the inverter transistor 150) are separated from each other by a predetermined distance or spacing 179X (in the gate length direction), while the openings 164C, 164D (above the non-inverter transistor 152) are separated from each other by a predetermined distance or spacing 179Y (in the gate length direction), wherein the distance 179X is less than the distance 179Y. As will be appreciated by those skilled in the art after a complete reading of the present application, in this example, the desired and predetermined TDCG spacing 122 (described above) is achieved by essentially shifting the mask opening 164B (and the SD contact opening 166B that is formed after etching) closer to the conductive gate structure 101 on the inverter transistor 150. Stated another way, this predetermined and desired TDCG spacing 122 of the drain contact structure 110 on the inverter transistor 150 was achieved by forming the mask openings 164A, 164B with a predetermined smaller spacing 179X between them than the predetermined spacing 179Y between the mask openings 164C, 164D above the non-inverter transistor 152.

Figure 7:
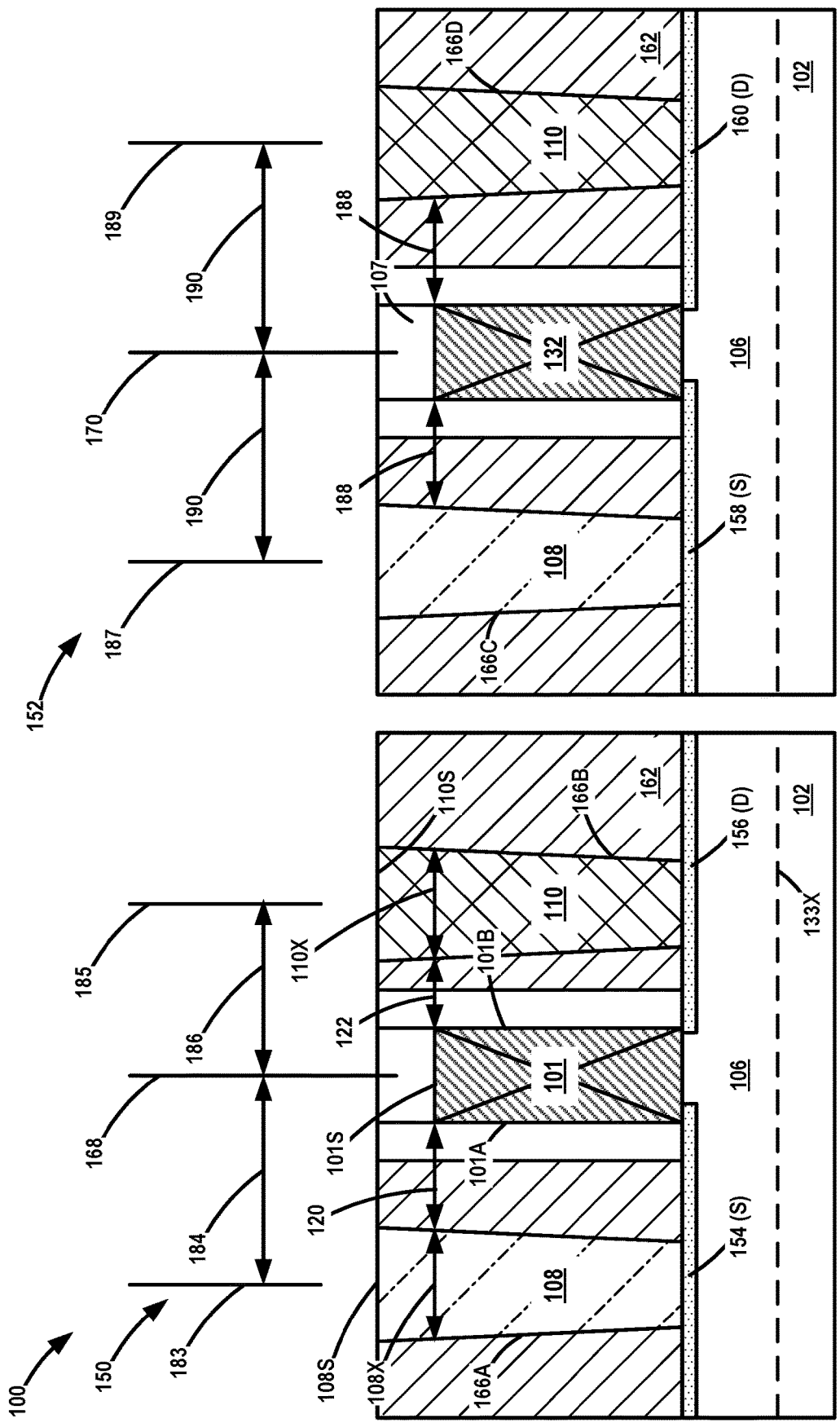

FIG. 7 depicts the product after one or more common process operations were performed to form illustrative source contact structures 108 and drain contact structures 110 for the transistor devices 150, 152 at the same time. As depicted, the source contact structure 108 and the drain contact structure 110 have been formed in their intended predetermined targeted positions wherein the source contact structure 108 is spaced from a first (nearest) side 101A of the gate structure 101 by a distance equal to the predetermined TSCG spacing 120, while the drain contact structure 110 is spaced apart from a second (nearest) side 101B of the gate structure 101 by a distance equal to the predetermined TDCG spacing 122. As noted above, the spacing distances referenced herein may be measured at a first level corresponding to the level of the uppermost surface 101S of the gate structure 101. Also note that, in this embodiment, the source contact structure 108 has a lateral dimension 108X that is approximately the same as the lateral dimension 110X of the drain contact structure 110 (again measured at the first level). In this example, the vertical centerline 183 of the source contact structure 108 is positioned a distance 184 from the vertical centerline 168 of the gate structure 101, while the vertical centerline 185 of the drain contact structure 110 is positioned a lesser distance 186 from the vertical centerline 168 of the gate structure 101.

In contrast, while the source contact structures 108 and drain contact structures 110 for both the non-inverter transistor 152 and the inverter transistor 150 are approximately the same physical size, on the non-inverter transistor 152, the source contact structure 108 and the drain contact structure 110 are positioned symmetrically relative to the gate structure 132. More specifically, the source contact structure 108 and the drain contact structure 110 on the non-inverter transistor 152 are positioned approximately the same distance 188 from the nearest sides of the gate structure 132, and the vertical centerlines 187, 189 of the source contact structure 108 and the drain contact structure 110, respectively, are positioned approximately the same distance 190 from the vertical centerline 170 of the gate structure 132.

The source contact structures 108 and the drain contact structures 110 may be formed of any desired materials and they may be formed using any desired technique. In one embodiment, where the source contact structures 108 and the drain contact structures 110 comprise a trench silicide structure, the process flow of forming the source contact structures 108 and the drain contact structures 110 may be as follows. First, a traditional metal silicide region (not separately shown) may be formed through the SD contact openings 166A-D on the exposed portions of the source/drain regions. Thereafter, a metal, such as tungsten (not separately shown) may be deposited on the metal silicide regions so as to overfill the SD contact openings 166A-D. At that point, a chemical mechanical polishing (CMP) process may be performed that stops on the top of the gate caps 107 to remove excess amounts of the tungsten material.

Figure 8:
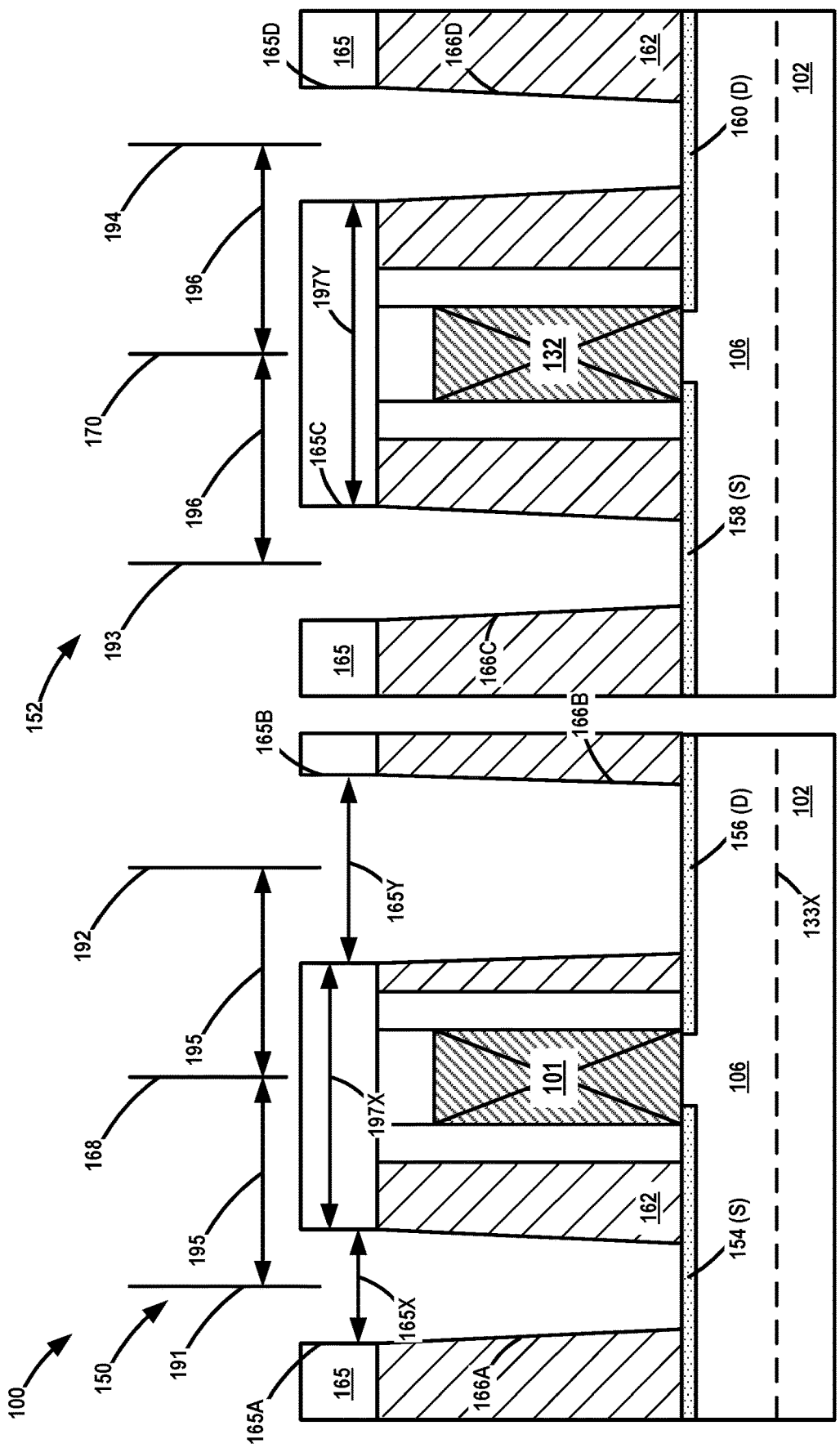
Figure 9:
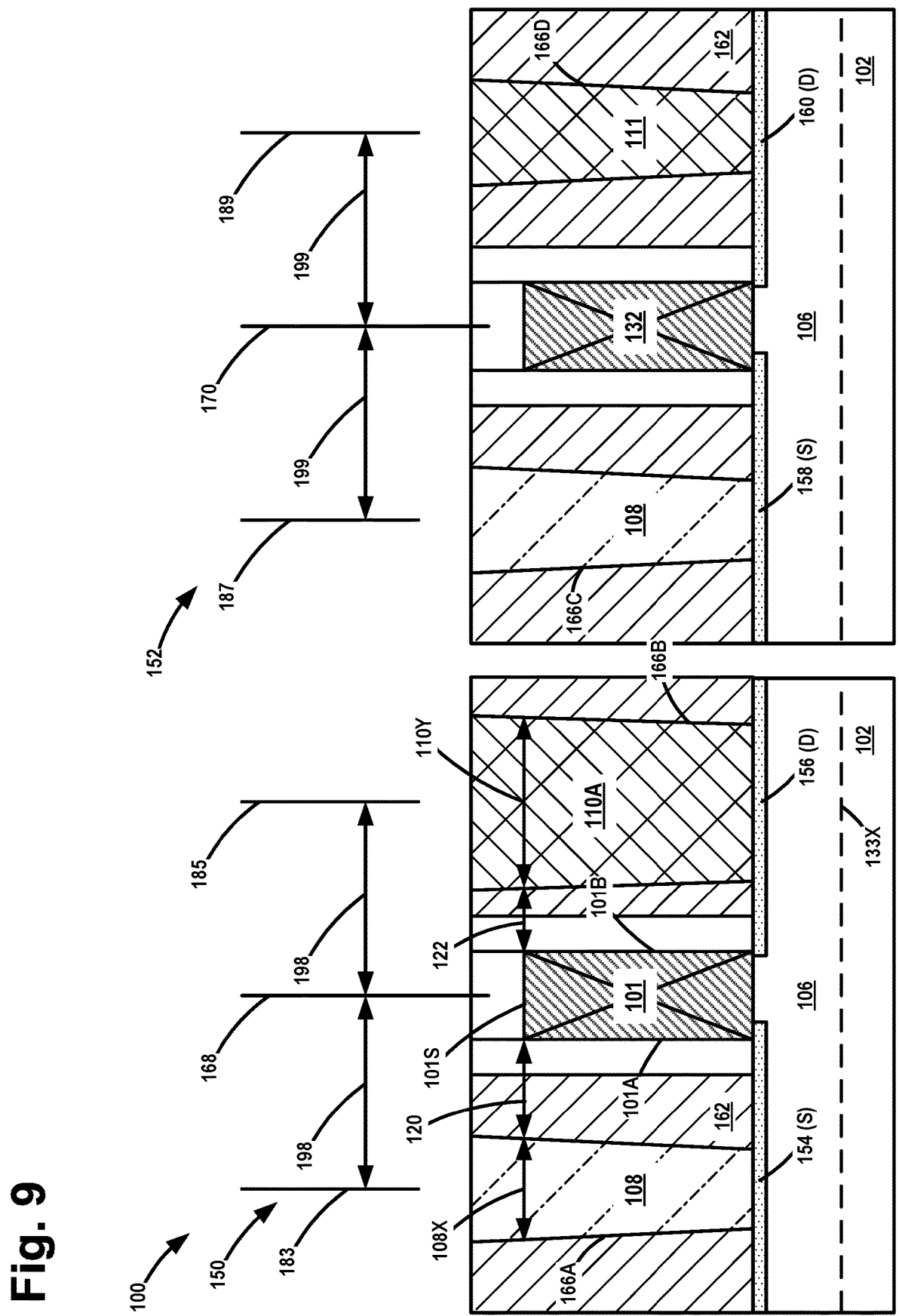

FIGS. 3, 8 and 9 depict an alternative arrangement where the desired lesser TDCG spacing 122 is achieved by making a drain contact structure 110A that is physically larger than the source contact structure 108. FIG. 8 depicts the product 100 after several process operations were performed. First a patterned etch mask 165, e.g., a patterned layer of photoresist or a patterned hard mask layer, was formed above the layer of insulating material 162 on both the inverter transistor 150 and the non-inverter transistor 152. The patterned etch mask 165 comprises a plurality of mask contact openings 165A, 165B, 165C and 165D. Thereafter, one or more common etching processes were performed through the patterned etch mask 165 to simultaneously define the plurality of SD contact openings 166A, 166B, 166C and 166D so as to expose portions of the source/drain regions 154, 156, 158 and 160, respectively, of the devices 150, 152. In this embodiment, each of the mask openings 165A, C and D in the patterned etch mask 165 are the same size, i.e., each of the mask openings 165A, C and D has a dimension 165X (e.g., a width) in the gate length (GL) direction of the transistor devices that is the same. However, the mask opening 165B has a dimension 165Y (e.g., a width) in the gate length direction that is larger than the dimension 165X, i.e., the mask opening 165B is larger than the mask opening 165A (and 165C and D as well). The mask openings 165A-D may all be of the same size or of different sizes in the gate width (GW) direction of the devices, i.e., into and out of the plane of FIG. 8. The mask openings 165A-B are intentionally formed in the patterned etch mask 165 with the desired predetermined spacing and different sizes such that the resulting source contact structure 108 and the drain contact structure 110A that will be formed for the inverter transistor 150 in the SD contact openings 166A, 166B, respectively, will be spaced asymmetrically relative to the conductive gate structure 101 and have the desired lesser TDCG spacing 122, as described above. The mask openings 165C-D are intentionally formed in the patterned etch mask 165 with a predetermined desired spacing and positioning such that the resulting source contact structure 108 and the drain contact structure 111 that will be formed for the non-inverter transistor 152 in the SD contact openings 164C, 164D, respectively, will be spaced symmetrically relative to the conductive gate structure 132, i.e., the source contact structure 108 and the drain contact structure 111 on the non-inverter transistor 152 will be equally spaced from the conductive gate structure 132.

More specifically, and with continued reference to FIG. 8, the conductive gate structure 101, the mask opening 165A, the mask opening 165B, the conductive gate structure 132, the mask opening 165C and the mask opening 165D have vertical centerlines 168, 191, 192, 170, 193 and 194, respectively. The mask openings 165A, 165B correspond to the location where the source contact structure 108 and the larger drain contact structure 110A, respectively, will be formed for the inverter transistor 150 in the insulating material 162. The mask openings 165C, 165D correspond to the location where the source contact structure 108 and the drain contact structure 111 (which is the same size as that of the source contact structure in this example), respectively, will be formed for the non-inverter transistor 152 in the insulating material 162. In this example, the patterned etch mask 165 is intentionally formed and positioned such that the vertical centerlines 191, 192 of the mask openings 165A, 165B, respectively, are spaced approximately the same distance 195 from the vertical centerline 168 of the conductive gate structure 101. Of course, in other applications, the patterned etch mask 165 may be formed such that the vertical centerlines 191, 192 of the mask openings 165A, 165B, respectively, are spaced unequal distances from the vertical centerline 168 of the conductive gate structure 101. As with the example above, the patterned etch mask 165 is intentionally formed and positioned such that the vertical centerlines 193, 194 of the mask openings 165C, 165D are each spaced an equal distance 196 from the vertical centerline 170 of the conductive gate structure 132. Additionally, the openings 165A, 165B (above the inverter transistor 150) are separated from each other by a distance or spacing 197X (in the gate length direction), while the openings 165C, 165D (above the non-inverter transistor 152) are separated from each other by a distance or spacing 197Y (in the gate length direction), wherein the distance 197X is less than the distance 197Y.

FIG. 9 depicts the product after one or more common process operations were performed to form illustrative source contact structures 108 and drain contact structures 110A, 111 for the transistor devices 150, 152 at the same time. As depicted, the source contact structure 108 and the physically larger drain contact structure 110A have been formed in their intended predetermined targeted positions wherein the source contact structure 108 is spaced from a first (nearest) side 101A of the gate structure 101 by a distance equal to the TSCG spacing 120, while the larger drain contact structure 110A is spaced apart from a second (nearest) side 101B of the gate structure 101 by a distance equal to the TDCG spacing 122. As noted above, the spacing distances are measured at a first level corresponding to the level of the uppermost surface 101S of the gate structure 101. Also note that, in this embodiment, the source contact structure 108 for the inverter transistor 152 has a lateral dimension 108X that is less than the lateral dimension 110Y of the physically larger drain contact structure 110A (again measured at the first level). In this example, the vertical centerlines 183, 185 of the source contact structure 108 and the drain contact structure 110A, respectively, are positioned approximately the same distance 198 from the vertical centerline 168 of the gate structure 101.

In contrast, the source contact structure 108 and drain contact structure 111 for the non-inverter transistor 152 are approximately the same physical size; and they are positioned symmetrically relative to the gate structure 132 of the non-inverter transistor 152. More specifically, the vertical centerlines 187, 189 of the source contact structure 108 and the drain contact structure 111, respectively, are positioned approximately the same distance 199 from the vertical centerline 170 of the gate structure 132.

In some applications, the source contact structures 108 and drain contact structures 110 are self-aligned contact structures. In general, self-aligned contacts are formed by performing an etching process to remove a first material (e.g., silicon dioxide) so as to define a contact opening, wherein the size and shape of the resulting contact opening is defined by the boundaries of adjacent structures (e.g., sidewall spacers) that are of a different second material (e.g., silicon nitride) that exhibits etch selectivity relative to the first material. The formation of self-aligned contacts does not require the same precision as it relates to the proper positioning and alignment of a patterned etch mask relative to the more limited tolerance for such patterned etch masks when forming traditional, non-self-aligned contacts.

In the case where the source contact structures 108 and drain contact structures 110 are self-aligned contact structures, the desired lesser TDCG spacing 122 may be achieved by forming the gate structures (using either gate-first or replacement gate manufacturing techniques) on the IC product such that the gate-to-gate spacing on the drain side (D) of the inverter transistors is larger than the gate-to-gate spacing on the source side (S) of the inverter transistors. During the self-aligned contact etching process, more of the sidewall spacers will be consumed in the area with the larger gate-to-gate spacing, i.e., on the drain side (D) of the inverter transistors. The net effect of the thinner spacer on the drain side (D) of the inverter transistors is that the resulting drain contact structures 110 will be positioned laterally closer to the gate structure for the inverter transistors as compared to the relatively larger spacing between the source contact structures 108 and the gate structure for the inverter transistors.

Figure 10:
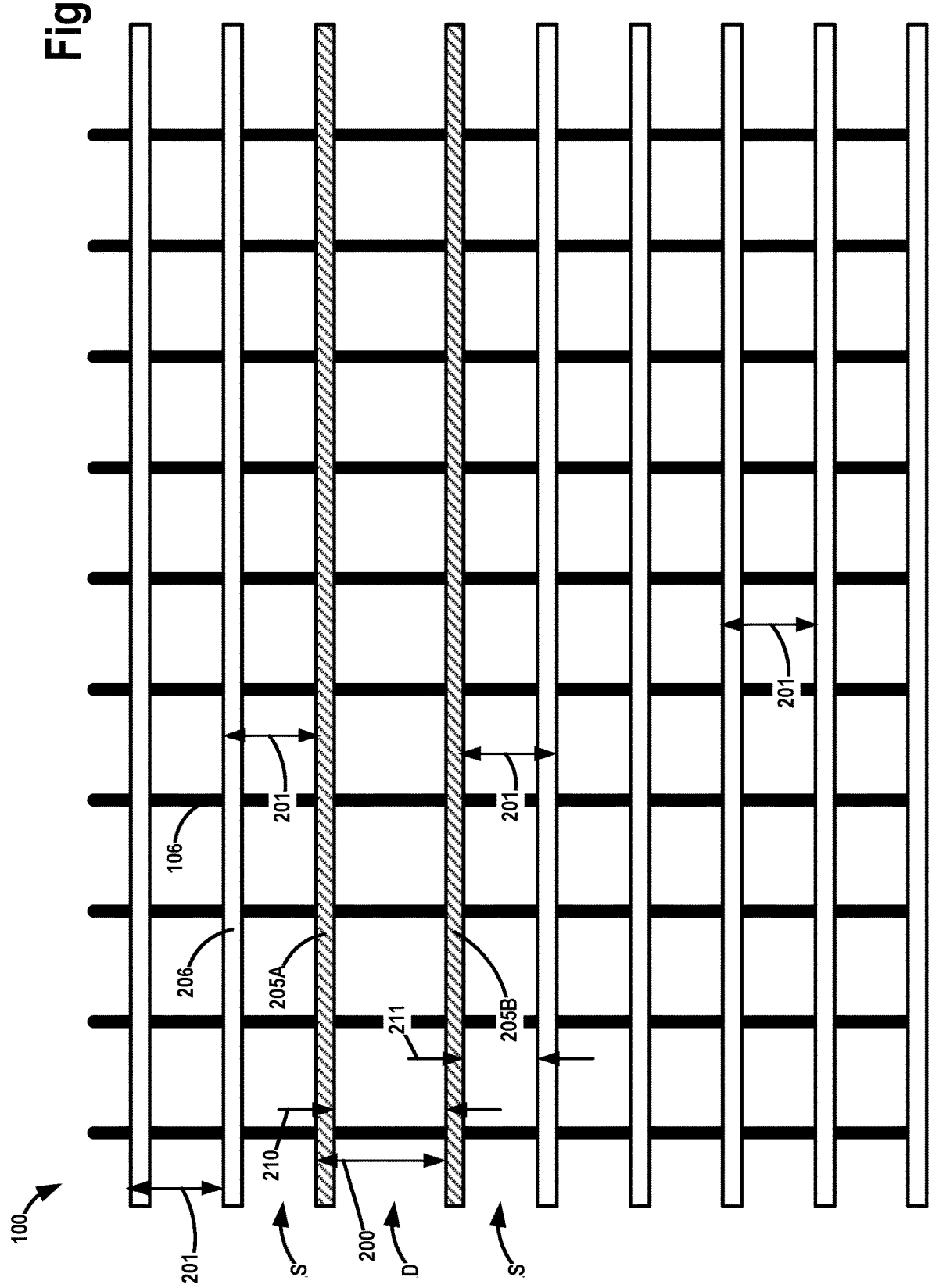

With reference to FIG. 10, after the formation of the fins 106 across the substrate 102, various continuous gate structures 205A, 205B, 206 will be formed across the fins 106. As noted above, the continuous gate structures 205A, 205B, 206 may be sacrificial gate structures at this point in the process flow (for replacement gate manufacturing processes) or they may be final gate structures (for gate-first manufacturing processes). The continuous gate structures 205A, 205B are formed with a first gate pitch 200, while the continuous gate structures 206 are formed with a second gate pitch 201, wherein the first gate pitch 200 is greater than the second gate pitch 201. The various gate structures of the inverters 124A, 124B will be formed from the more widely spaced continuous gate structures 205A, 205B, while gate structures for other transistors formed above the substrate 102 (e.g., transistors for non-inverter circuits) may be formed from the continuous gate structures 206 that are formed with the smaller gate pitch 201. Of course, if desired, gate structures for transistor devices for non-inverter circuits may also be formed from the wider spaced continuous gate structures 205A, 205B. The gate structures 205A, 205B have a gate-to-gate spacing 210 on what will become the drain side (D) of the inverter transistors and a gate-to-gate spacing 211 on what will become the source side (S) of the inverter transistors, wherein the spacing 210 is greater than the spacing 211. In one illustrative example, the gate-to-gate spacing 210 may be about 2-4 nm greater than the gate-to-gate spacing 211.

Eventually, the continuous gate structures 205A, 205B, 206 will be cut into separate gate structures that are spaced apart from one another by performing various masking and etching processes. For example, the continuous gate structure 205A may be cut to define or form the conductive gate structures 101 and 104 of the first inverter 124A, while the continuous gate structure 205B will be cut to define or form the conductive gate structures 103 and 102 of the second inverter 124B. The continuous gate structures 206 will also be cut into smaller gate structure segments (not shown) for other transistor devices. After the continuous gate structures 205A, 205B, 206 are cut, an insulating material, e.g., silicon nitride, will be formed in the space created by cutting the continuous gate structures 205A, 205B, 206. Eventually, a sidewall spacer (not shown) will be formed adjacent each of the cut gate structures. Due to the larger spacing 210, the spacers formed on the drain side (D) of the inverter transistors will have a lesser thickness as compared to the spacers formed on the source side (S) of the inverter transistors.

Figure 11:
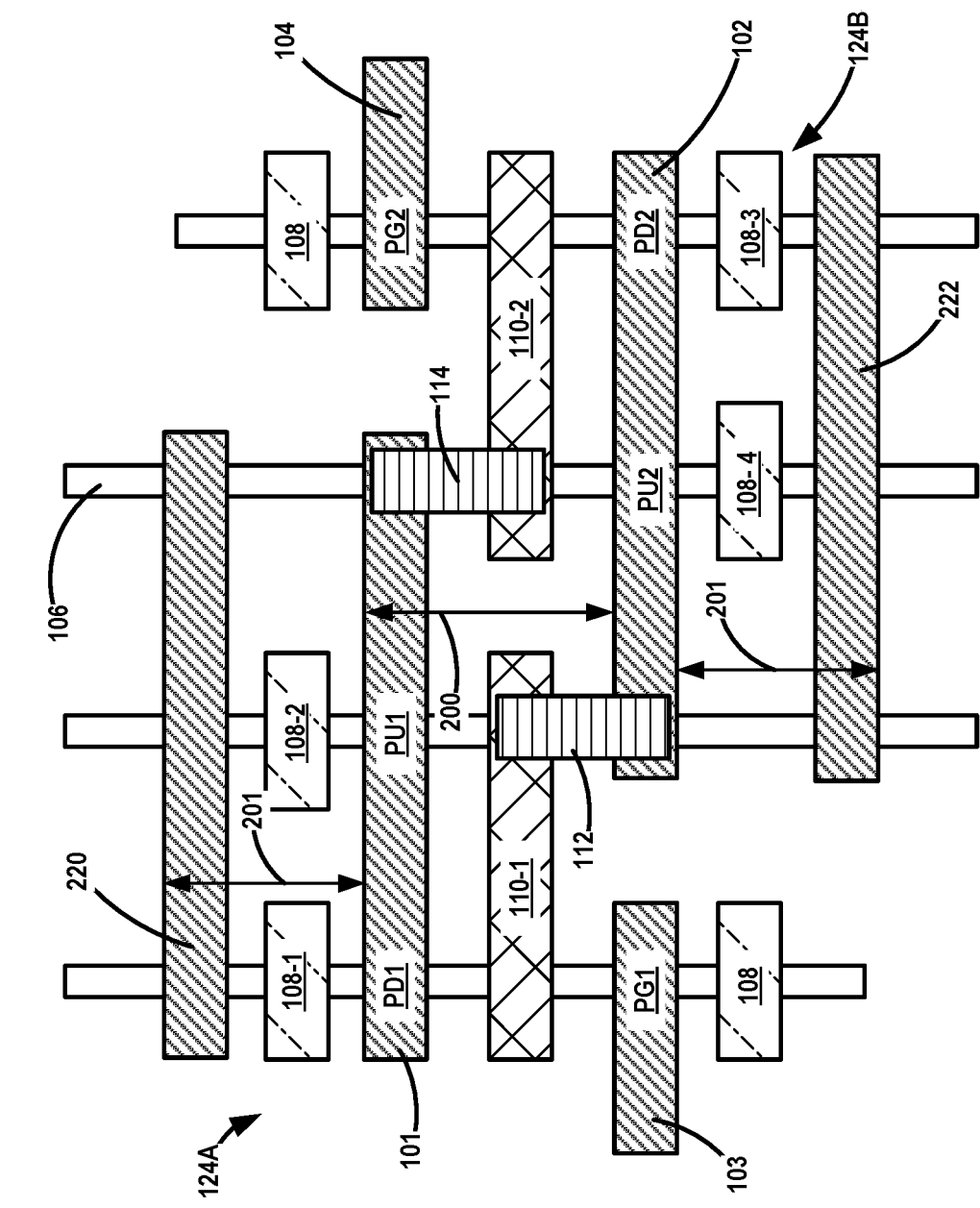

FIG. 11 is a simplistic plan view of an illustrative integrated circuit product 100 wherein various gate structures were formed with different gate pitches as described above. More specifically, the product 100 comprises a first inverter 124A comprised of a first transistor (PD1) and a second transistor (PU1) that are of opposite types, wherein the first and second transistors share a first gate structure 101. The IC product 100 also includes a second inverter 124B comprised of a third transistor (PD2) and a fourth transistor (PU2) that are of opposite types, wherein the third and fourth transistors share a second gate structure 102 that is positioned immediately adjacent the first gate structure 101. The first and second gate structures are formed with a first gate pitch 200. The IC product further includes a third gate structure 220 positioned immediately adjacent the first gate structure 101, wherein the first and third gate structures are formed with a second gate pitch 201. The IC product 100 also includes a fourth gate structure 222 positioned immediately adjacent the second gate structure 102, wherein the second and fourth gate structures are also formed with the second gate pitch 201. As depicted, the second gate pitch 201 is less than the first gate pitch 200.

With continuing reference to FIG. 11, the product also includes a first source contact structure 108-1 and a second source contact structure 108-2 for the first and second transistors, respectively, wherein the first and second source contact structures are positioned between the first gate structure 101 and the third gate structure 220. The product also includes a third source contact structure 108-3 and a fourth source contact structure 108-4 for the third and fourth transistors, respectively, wherein the third and fourth source contact structures are positioned between the second gate structure 102 and the fourth gate structure 222. The integrated circuit product also includes a first common conductive drain contact structure 110-1 that is conductively coupled to a first drain region and a second drain region of the first and second transistors, respectively, wherein at least a portion of the first common conductive drain contact structure 110-1 is positioned between the first and second gate structures. 101, 102. The integrated circuit product also includes a second common conductive drain contact structure 110-2 that is conductively coupled to a third drain region and a fourth drain region of the third and fourth transistors, respectively, wherein a portion of the second common conductive drain contact structure 110-2 is positioned between the first and second gate structures 101, 102.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a first transistor for an inverter above a semiconductor substrate, said first transistor comprising a source region, a drain region and a first gate structure having first and second opposing sides;
    forming asymmetrically spaced first and second conductive contact structures that are conductively coupled to said source region and said drain region, respectively, wherein said first conductive contact structure is positioned proximate a first predetermined target distance from said first side of said first gate structure at a first level corresponding to an upper surface of said first gate structure and said second conductive contact structure is positioned proximate a second predetermined target distance from said second side of said first gate structure at said first level, said second predetermined target distance being less than said first predetermined target distance; and
    forming a second transistor for said inverter above said semiconductor substrate, wherein said second transistor is of an opposite type to said first transistor and wherein said first and second transistors share said first gate structure, wherein said second transistor comprises a source region and a drain region, and wherein said second conductive contact structure is further conductively coupled to said drain region of said second transistor.

2. The method of claim 1, wherein said asymmetrically spaced first and second conductive contact structures are formed such that, in a gate length direction of said first transistor, said asymmetrically spaced first and second conductive contact structures have first and second lateral dimensions, respectively, at said first level, wherein said first and second lateral dimensions are approximately the same.

3. The method of claim 1, wherein said asymmetrically spaced first and second conductive contact structures are formed such that, in a gate length direction of said first transistor, a vertical centerline of said first conductive contact structure is located a first distance from a vertical centerline of said first gate structure and a vertical centerline of said second conductive contact structure is located a second distance from said vertical centerline of said first gate structure, and wherein said second distance is less than said first distance.

4. The method of claim 1, wherein said asymmetrically spaced first and second conductive contact structures are formed such that, in a gate length direction of said first transistor, said asymmetrically spaced first and second conductive contact structures have first and second lateral dimensions, respectively, at said first level, wherein said second lateral dimension is greater than said first lateral dimension.

5. The method of claim 1, wherein said asymmetrically spaced first and second conductive contact structures are formed such that, in a gate length direction of said first transistor, a vertical centerline of said first conductive contact structure is located a first distance from a vertical centerline of said first gate structure and a vertical centerline of said second conductive contact structure is located a second distance from said vertical centerline of said first gate structure, wherein said first and second distances are approximately the same.

6. The method of claim 1, further comprising forming a third conductive contact structure that is conductively coupled to said source region of said second transistor.

7. The method of claim 1, wherein said second predetermined target distance is approximately 70-90% of said first predetermined target distance.

8. An inverter, comprising:
    a first transistor and a second transistor that are of opposite types, each of said first and second transistors comprising a source region and a drain region, said first and second transistors sharing a first gate structure having first and second opposing sides;
    a conductive source contact structure that is conductively coupled to said source region of said first transistor, wherein said conductive source contact structure has a first lateral dimension in a gate length direction of said first transistor at a first level corresponding to an upper surface of said first gate structure, and wherein said conductive source contact structure is positioned a first distance from said first side of said first gate structure at said first level; and
    a common conductive drain contact structure that is conductively coupled to said drain region of both said first and second transistors, wherein said common conductive drain contact structure has a second lateral dimension at said first level, wherein said second lateral dimension is greater than said first lateral dimension, and wherein said common conductive drain contact structure is positioned a second distance from said second side of said first gate structure at said first level, said second distance being less than said first distance.

9. The inverter of claim 8, wherein, in a gate length direction of said first transistor, a vertical centerline of said conductive source contact structure is located a first distance from a vertical centerline of said first gate structure and a vertical centerline of said common conductive drain contact structure is located a second distance from said vertical centerline of said first gate structure, wherein said first and second distances are approximately the same.

10. The inverter of claim 9, further comprising a second conductive source contact structure that is conductively coupled to said source region of said second transistor.

11. The inverter of claim 9, wherein said second conductive source contact structure has a lateral dimension in said gate length direction of said first transistor at said first level that is approximately equal to said first lateral dimension and wherein said second conductive source contact structure is positioned a distance from said first side of said first gate structure at said first level that is approximately equal to said first distance.

12. A method, comprising:

forming a first transistor for an inverter above a semiconductor substrate, said first transistor comprising a source region, a drain region and a first gate structure having first and second opposing sides;

forming asymmetrically spaced first and second conductive contact structures that are conductively coupled to said source region and said drain region, respectively, wherein said first conductive contact structure is positioned proximate a first predetermined target distance from said first side of said first gate structure at a first level corresponding to an upper surface of said first gate structure and said second conductive contact structure is positioned proximate a second predetermined target distance from said second side of said first gate structure at said first level, said second predetermined target distance being less than said first predetermined target distance;

forming a second transistor above said semiconductor substrate for a non-inverter circuit, said second transistor comprising a source region, a drain region and a second gate structure having first and second opposing sides; and forming symmetrically spaced third and fourth conductive contact structures that are conductively coupled to said source region and said drain region, respectively, of said second transistor, wherein said third conductive contact structure is positioned proximate a third predetermined target distance from said first side of said second gate structure at a second level corresponding to an upper surface of said second gate structure and said fourth conductive contact structure is positioned proximate a fourth predetermined target distance from said second side of said second gate structure at said second level, said third predetermined target distance being approximately the same as said fourth predetermined target distance.

13. The method of claim 12, wherein forming said asymmetrically spaced first and second conductive contact structures and forming said symmetrically spaced third and fourth conductive contact structures comprises:

forming at least one layer of insulating material above at least said source region and said drain region of both said first and second transistors;

forming a patterned etch mask above said at least one layer of insulating material, said patterned etch mask comprising a plurality of mask openings;

performing at least one etching process through said mask openings in said patterned etch mask to form first, second, third and fourth contact openings in said at least one layer of insulating material; and performing at least one common processing operation to form said asymmetrically spaced first and second conductive contact structures in said first and second contact openings, respectively, and said symmetrically spaced third and fourth conductive contact structures in said third and fourth contact openings, respectively.

14. The method of claim 12, wherein said asymmetrically spaced first and second conductive contact structures are formed such that, in a gate length direction of said first transistor, said asymmetrically spaced first and second conductive contact structures have first and second lateral dimensions, respectively, at said first level, wherein said first and second lateral dimensions are approximately the same.

15. The method of claim 12, wherein said asymmetrically spaced first and second conductive contact structures are formed such that, in a gate length direction of said first transistor, a vertical centerline of said first conductive contact structure is located a first distance from a vertical centerline of said first gate structure and a vertical centerline of said second conductive contact structure is located a second distance from said vertical centerline of said first gate structure, and wherein said second distance is less than said first distance.

16. The method of claim 12, wherein said asymmetrically spaced first and second conductive contact structures are formed such that, in a gate length direction of said first transistor, said asymmetrically spaced first and second conductive contact structures have first and second lateral dimensions, respectively, at said first level, wherein said second lateral dimension is greater than said first lateral dimension.

17. The method of claim 12, wherein said asymmetrically spaced first and second conductive contact structures are formed such that, in a gate length direction of said first transistor, a vertical centerline of said first conductive contact structure is located a first distance from a vertical centerline of said first gate structure and a vertical centerline of said second conductive contact structure is located a second distance from said vertical centerline of said first gate structure, wherein said first and second distances are approximately the same.

\* \* \* \* \*